(12) United States Patent
Li et al.

(10) Patent No.: US 11,362,186 B2
(45) Date of Patent: Jun. 14, 2022

(54) NON-VOLATILE MEMORY DEVICE AND METHOD FOR MANUFACTURING THE SAME

(71) Applicant: United Microelectronics Corp., Hsinchu (TW)

(72) Inventors: Kuo-Lung Li, Tainan (TW); Chih-Hao Pan, Kaohsiung (TW); Szu-Ping Wang, Tainan (TW); Po-Hsuan Chen, Tainan (TW); Chi-Cheng Huang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/831,846

(22) Filed: Mar. 27, 2020

(65) Prior Publication Data
US 2021/0265474 A1 Aug. 26, 2021

(30) Foreign Application Priority Data
Feb. 21, 2020 (CN) .......................... 202010108951.6

(51) Int. Cl.
| | | |
|---|---|---|
| *H01L 29/423* | (2006.01) | |
| *H01L 27/1157* | (2017.01) | |
| *H01L 29/66* | (2006.01) | |
| *H01L 27/11573* | (2017.01) | |
| *H01L 29/792* | (2006.01) | |
| *H01L 21/28* | (2006.01) | |

(52) U.S. Cl.
CPC .... *H01L 29/42344* (2013.01); *H01L 27/1157* (2013.01); *H01L 27/11573* (2013.01); *H01L 29/40117* (2019.08); *H01L 29/66833* (2013.01); *H01L 29/792* (2013.01)

(58) Field of Classification Search
CPC ......... H01L 29/42344; H01L 29/40117; H01L 27/1157; H01L 29/66833; H01L 29/792
See application file for complete search history.

(56) References Cited

U.S. PATENT DOCUMENTS

| | | | |
|---|---|---|---|
| 7,416,945 B1 | 8/2008 | Muralidhar et al. | |
| 9,165,652 B2 | 10/2015 | Kang et al. | |
| 9,583,641 B1* | 2/2017 | Chang | ............... H01L 29/42344 |
| 2011/0309434 A1* | 12/2011 | Huang | ................. H01L 29/518 |
| | | | 257/326 |
| 2013/0294161 A1 | 11/2013 | Lee et al. | |
| 2016/0049421 A1* | 2/2016 | Zhang | ................ H01L 29/7845 |
| | | | 257/314 |

OTHER PUBLICATIONS

Purakh Raj Verma et al., "High Resistivity Wafer With Heat Dissipation Structure and Method of Making the Same", Unpublished U.S. Appl. No. 16/170,067, filed Oct. 25, 2018.

* cited by examiner

*Primary Examiner* — Mohammad M Choudhry
(74) *Attorney, Agent, or Firm* — J.C. Patents

(57) ABSTRACT

A non-volatile memory device is provided. The non-volatile memory device includes a substrate, a first gate structure disposed on the substrate, a second gate structure disposed on the substrate, and a memory gate structure disposed on the substrate and between the first gate structure and the second gate structure. The memory gate structure at least covers the first gate structure and the second gate structure. The memory gate structure includes a charge storage layer disposed on the substrate and a memory gate layer disposed on the charge storage layer.

13 Claims, 4 Drawing Sheets

NON-VOLATILE MEMORY DEVICE AND METHOD FOR MANUFACTURING THE SAME

CROSS-REFERENCE TO RELATED APPLICATION

This application claims the priority benefit of the China patent application serial no. 202010108951.6, filed on Feb. 21, 2020. The entirety of the above-mentioned patent application is hereby incorporated by reference herein and made a part of this specification.

BACKGROUND

Technical Field

The disclosure relates to a semiconductor manufacturing technology, and in particular, to a non-volatile memory device and a method for manufacturing the same.

Description of Related Art

Non-volatile memory devices are common memory devices which may be configured to store data. In response to the demand for small volume but large storage capacity, the structural design of the non-volatile memory devices has been continuously developed.

There may be various ways to apply the structure of the non-volatile memory devices, and more functions may be performed if the non-volatile memory devices are combined with peripheral circuits including logic circuits. The non-volatile memory devices are configured to store binary data but may have a variety of designs. According to different operation mechanisms, the corresponding structural designs may be changed. For instance, if the non-volatile memory device is combined with a peripheral circuit, a number of manufacturing steps may be included in the manufacturing process.

How to design the structure of the non-volatile memory device to simplify the manufacturing process is a topic which should be taken into account in research and development.

SUMMARY

The disclosure is directed to a non-volatile memory device and a method for manufacturing the same. Here, the non-volatile memory device includes three gate structures, and when the non-volatile memory device is formed together with a peripheral circuit, some steps of forming a mask layer may be omitted, so as to simplify the overall manufacturing process.

In an embodiment of the disclosure, a non-volatile memory device is provided. The non-volatile memory device includes a substrate, a first gate structure disposed on the substrate, a second gate structure disposed on the substrate, and a memory gate structure disposed on the substrate and between the first gate structure and the second gate structure. The memory gate structure covers at least the first gate structure and the second gate structure. The memory gate structure includes a charge storage layer disposed on the substrate and a memory gate layer disposed on the charge storage layer.

According to an embodiment of the disclosure, the charge storage layer has an oxide/nitride/oxide (ONO) structure.

According to an embodiment of the disclosure, sidewalls of the memory gate layer and the charge storage layer on the first gate structure and the second gate structure are aligned.

According to an embodiment of the disclosure, the memory gate layer and the charge storage layer cover at least one portion of upper surfaces of the first gate structure and the second gate structure.

According to an embodiment of the disclosure, the non-volatile memory device further includes a spacer on sidewalls of the first gate structure and the second gate structure, and the spacer is covered by the charge storage layer.

According to an embodiment of the disclosure, the memory gate structure fills a recess between the first gate structure and the second gate structure, and a side area of the memory gate structure is lifted to cover at least one portion of upper surfaces of the first gate structure and the second gate structure.

According to an embodiment of the disclosure, the non-volatile memory device further includes a third gate structure disposed on the substrate.

According to an embodiment of the disclosure, the first gate structure is configured to transmit a voltage value corresponding to binary data to the memory gate structure, and the second gate structure is configured to output the binary data.

In an embodiment of the disclosure, a method for manufacturing a non-volatile memory device is provided, and the method includes providing a substrate, forming a first gate structure and a second gate structure on the substrate, forming a charge storage layer that covers the first gate structure, the second gate structure, and the substrate, forming a memory gate layer on the charge storage layer, and defining the memory gate layer and the charge storage layer to form a memory gate structure, wherein the memory gate structure covers at least the first gate structure and the second gate structure.

According to an embodiment of the disclosure, the charge storage layer has an ONO structure.

According to an embodiment of the disclosure, the memory gate layer and the charge storage layer are defined with use of the same mask layer.

According to an embodiment of the disclosure, the memory gate layer and the charge storage layer cover at least one portion of upper surfaces of the first gate structure and the second gate structure.

According to an embodiment of the disclosure, the method further includes forming a spacer on sidewalls of the first gate structure and the second gate structure, and the spacer is covered by the charge storage layer.

According to an embodiment of the disclosure, the memory gate structure fills a recess between the first gate structure and the second gate structure, and a side area of the memory gate structure is lifted to cover at least one portion of upper surfaces of the first gate structure and the second gate structure.

According to an embodiment of the disclosure, the method for manufacturing the non-volatile memory device further includes a third gate structure disposed on the substrate.

According to an embodiment of the disclosure, the first gate structure is configured to transmit a voltage value corresponding to binary data to the memory gate structure, and the second gate structure is configured to output the binary data.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and together with the description serve to explain the principles of the disclosure.

BRIEF DESCRIPTION OF THE DRAWINGS

The disclosure relates to a non-volatile memory device and a method for manufacturing the same. The non-volatile memory device, for instance, includes three gate structures. The application of such a memory device with three gate structures may perform the function of storing data and may also perform the function of temporarily storing data if the memory device is combined with a peripheral circuit.

For instance, when the peripheral circuit is to be turned off, by applying an operating voltage to the gate structures, the current status data generated by the peripheral circuit may be temporarily stored in the non-volatile memory device. When the peripheral circuit is again activated, it is likely to read the stored status data from the non-volatile memory device. However, the application of the non-volatile memory device provided herein is not limited to what is described above.

The disclosure looks into the structure of a non-volatile memory device having three gate structures and proposes an improvement in the structural design as well as simplification of the manufacturing process to some extent.

Several embodiments are described below, but the disclosure is not limited to these embodiments. In addition, appropriate combinations between the embodiments may be allowed.

Figure 1:
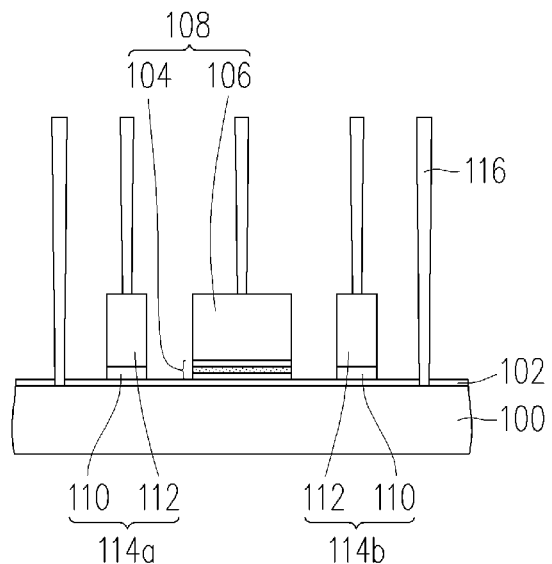
FIG. 1 is a schematic cross-sectional structural view of a non-volatile memory device according to an embodiment of the disclosure.

FIG. 1 is a schematic cross-sectional structural view of a non-volatile memory device according to an embodiment of the disclosure. With reference to FIG. 1, the basic structure of the memory device including three gate structures includes a substrate 100 where the required three gate structures are formed. During the manufacturing process, formation of doped regions may be included in the step of forming the gate structures in the substrate 100, so as to constitute a transistor structure. The structure of the doped regions and the process of forming the doped regions in the substrate 100 are not limited in the disclosure, and the relevant descriptions are omitted hereinafter. The formation of the gate structures is described below.

An oxide layer 102, e.g., a pad oxide layer 102, is formed on the substrate 100. Two general gate structures 114a and 114b and a memory gate structure 108 are formed on the pad oxide layer 102, respectively. The memory gate structure 108 is located between the two gate structures 114a and 114b. The gate structures 114a and 114b are general gate structures, for instance, and include a gate layer 110 and a gate insulation layer 112. Here, for instance, the gate insulation layer 112 may be combined with a portion of the pad oxide layer 102 below the gate layer 110. The disclosure is not limited to the structure of the gate insulation layer 112. The gate structures 114a and 114b are general gate structures, for instance, and are not able to store data.

The memory gate structure 108 for storing data includes a charge storage layer 104 and a gate layer 106. The charge storage layer 104 has, for instance, a stacked layer structure of oxide/nitride/oxide (ONO). The charge storage layer 104 may also be combined with one portion of the pad oxide layer 102 below the gate layer 106, for instance.

In addition, a plurality of contact plugs 116 may also be formed to allow an operating voltage to be applied to the gate structures 114a and 114b, the memory gate structure 108 and the substrate 100. Here, the contact plugs 116 are schematic; as a matter of fact, an inter-layer dielectric layer is formed in most cases, and the contact plugs 116 are formed in the inter-layer dielectric layer. Here, the manufacturing process of forming the contact plugs 116 is commonly known and thus will not be further described hereinafter. The manner of forming the contact plugs 116 is not limited to what is provided in the disclosure.

The disclosure further looks into the gate structures of the memory device shown in FIG. 1. The basic structure constituted by the three gate structures may achieve the expected functions, but the manufacturing process of respectively forming the gate structures 114a and 114b and the memory gate structure 108 is relatively complex. Here, a number of defining steps may be required in the overall manufacturing process, and the formation of mask layers for performing etching processes may also be included, for instance.

After the formation of the three gate structures, in an embodiment of the disclosure, the process of manufacturing the three gate structures is further described, and the process may be simplified without sacrificing the function required for the non-volatile memory device, for instance.

Figure 2:
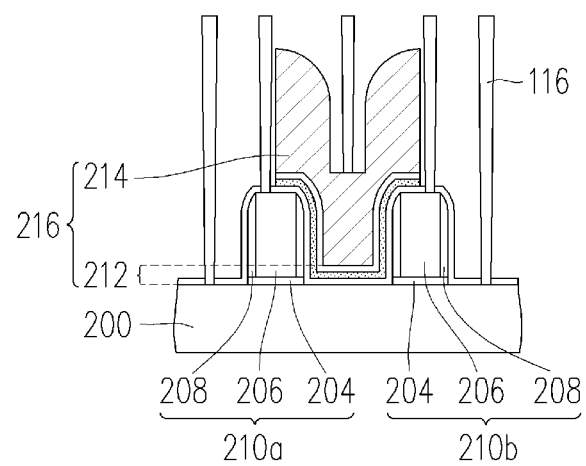
FIG. 2 is a schematic cross-sectional structural view of a non-volatile memory device according to an embodiment of the disclosure.

FIG. 2 is a schematic cross-sectional structural view of a non-volatile memory device according to an embodiment of the disclosure. With reference to FIG. 2, the non-volatile memory device includes a substrate 200. The gate structure 210a and the gate structure 210b are disposed on the substrate 200, respectively. The structure of the gate structure 210a and the gate structure 210b is, for instance, a gate structure of a general transistor, and includes a gate insulation layer 204 and a gate layer 206 on the gate insulation layer 204. In an embodiment, a spacer 208 may be formed on sidewalls of the gate structure 210a and the gate structure 210b. Since the structure of the gate structure 210a and the gate structure 210b is, for instance, the gate structure of a general transistor, the manufacturing process and the structure need not be particularly limited. For instance, the gate insulation layer 204 may be provided as a portion of an entire oxide layer.

In an embodiment, the memory gate structure 216 is disposed on the substrate 210 and between the gate structure 210a and the gate structure 210b. The memory gate structure 216 also includes a side area covering the gate structure 210a and the gate structure 210b. The memory gate structure 216 includes a charge storage layer 212 and a memory gate layer 214. The charge storage layer 212 is disposed on the substrate 200. The memory gate layer 214 is disposed on the charge storage layer 212, for instance.

In an embodiment, the side area of the memory gate structure 216 covers the gate structure 210a and the gate structure 210b, and therefore, for instance, the charge storage layer 212 also extends to sidewalls of the gate structure 210a and the gate structure 210b and further covers at least one portion of upper surfaces of the gate structure 210a and the gate structure 210b. In an embodiment, the gate structure 210a and the gate structure 210b include the spacer 208, and the charge storage layer 212 covers the spacer 208 on the sidewalls of the gate structure 210a and the gate structure 210b.

In an embodiment, the charge storage layer 212 has, for instance, an oxide/nitride/oxide stacked layer structure, and the stacked layer structure may be represented by ONO. In terms of manufacturing, the bottom oxide layer of the ONO stacked layer may also be retained to cover the substrate 200, for instance, so as to provide insulation for the substrate 200, which should however not be construed as a limitation in the disclosure.

The memory gate structure 216 described above may be formed in a way to simplify the overall manufacturing process. The gate structure 210a and the gate structure 210b are separated from the memory gate structure 216 by the charge storage layer 204 and the spacer 208, i.e., the sidewalls of the gate structure 210a and the gate structure 210b are separated by the charge storage layer 204 and the spacer 208. The memory gate structure 216 fills a recess between the gate structure 210a and the gate structure 210b, and a side area of the memory gate structure 1216 is lifted to cover at least one portion of the upper surfaces of the gate structure 210a and the gate structure 210b.

In addition, as illustrated in FIG. 1, for instance, the doped region in the substrate 200 and the conductive plugs 116 together with the inter-layer dielectric layer may be formed in a general manner, which should not be construed as a limitation in the disclosure and thus will not be further explained.

The manufacturing method is described below. FIG. 3 to FIG. 8 are cross-sectional structural views of a process for manufacturing a non-volatile memory device according to an embodiment of the disclosure.

Figure 3:
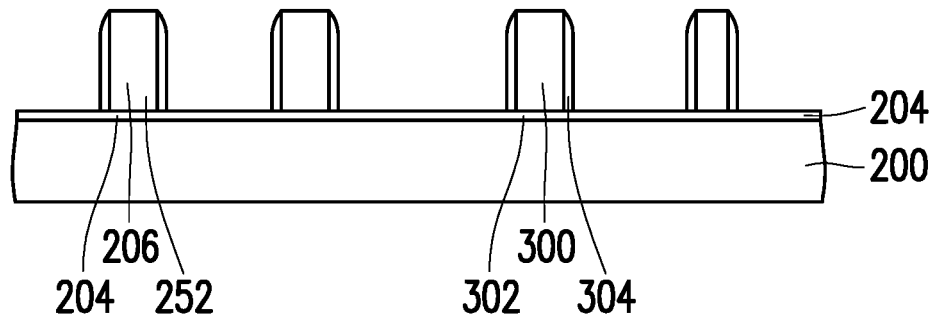
FIG. 3 to FIG. 8 are cross-sectional structural views of a process for manufacturing a non-volatile memory device according to an embodiment of the disclosure.

With reference to FIG. 3, an oxide layer 202 is formed on the substrate 200. Two gate layers 206 and a gate layer 300 belonging to a peripheral circuit are formed on the oxide layer 202. One portion of the oxide layer 202 below the gate layer 206 is, for instance, deemed as a gate insulation layer 204. The oxide layer 202 and the transistor of the peripheral circuit are commonly used, for instance, and the portion below the gate layer 300 serves as the gate insulation layer 302, for instance. In addition, a spacer 252 may be provided on a sidewall of the gate layer 206, and a spacer 304 may also be provided on a sidewall of the gate layer 300.

Figure 4:
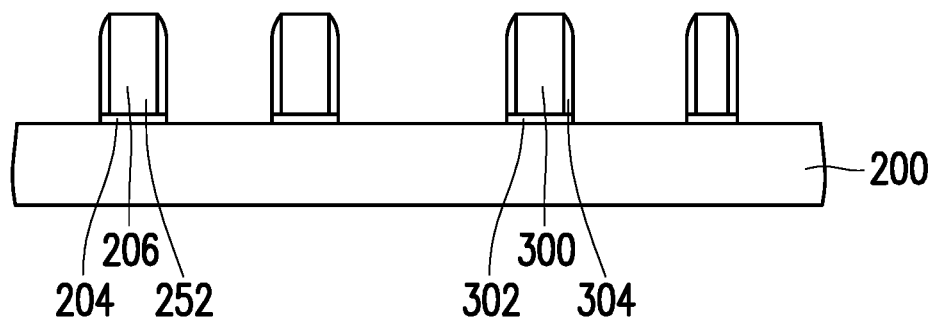

With reference to FIG. 4, in an embodiment, an area between the two gate layers 206 is expected to be reserved for a memory gate structure, so that one portion of the oxide layer 202 not covered by the gate layers 206 and 300 may be removed to expose the substrate 200, for instance. Here, most of the spacers 252 and 304 are retained, but the thickness may be reduced due to the cleansing process, for instance. The degree of retention of the spacer is not limited in the disclosure, and through the cleansing process, the surface of the substrate 200 may be exposed and cleansed.

Figure 5:
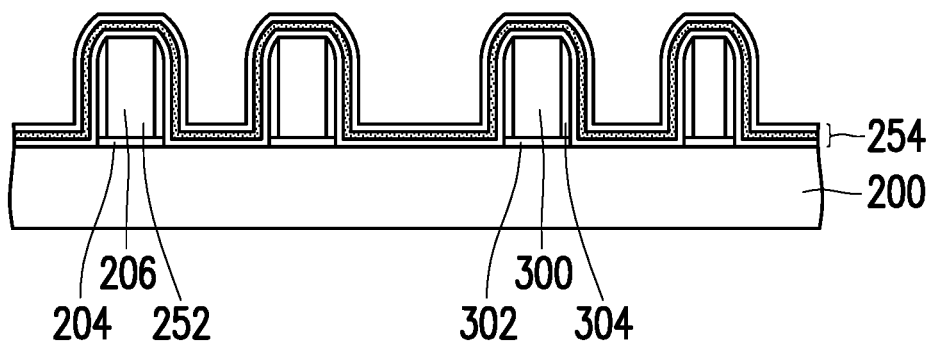

With reference to FIG. 5, a charge storage layer 254 is entirely formed on the substrate 200 and conformally covers the gate layers 206 and 300. The charge storage layer 212 is, for instance, an ONO stacked layer. The charge storage layer 212 covers the exposed and cleansed surface of the substrate 200, including the area between the two gate layers 206.

Figure 6:
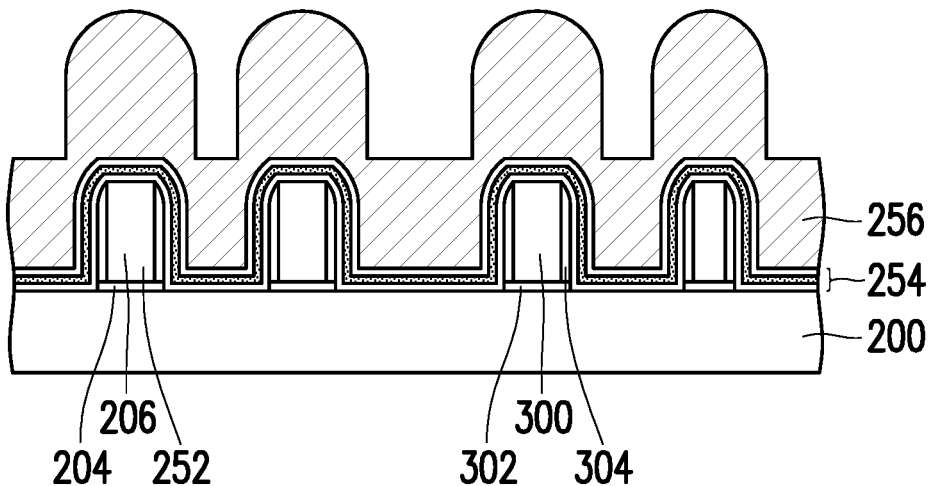

With reference to FIG. 6, a gate layer 256, e.g., a polysilicon layer, is entirely formed on the charge storage layer 254. The gate layer 256 overlaps the charge storage layer 254 and fills a recess between the two gate layers 206.

Figure 7:
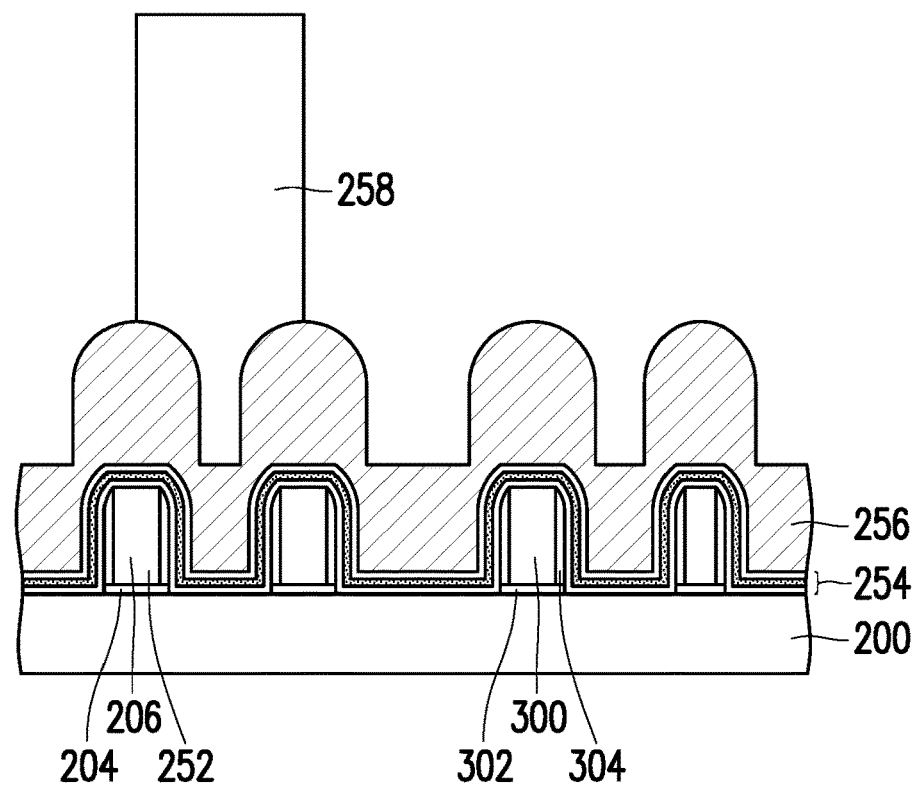

With reference to FIG. 7, a photoresist layer 258 is formed on the gate layer 256. The photoresist layer 258 covers an area between the two gate layers 206 and extends to at least one portion above the two gate layers 206. The photoresist layer 258 serves as an etching mask layer, and the area covered by the photoresist layer 258 is an area where a memory gate structure is expected to be formed.

Figure 8:
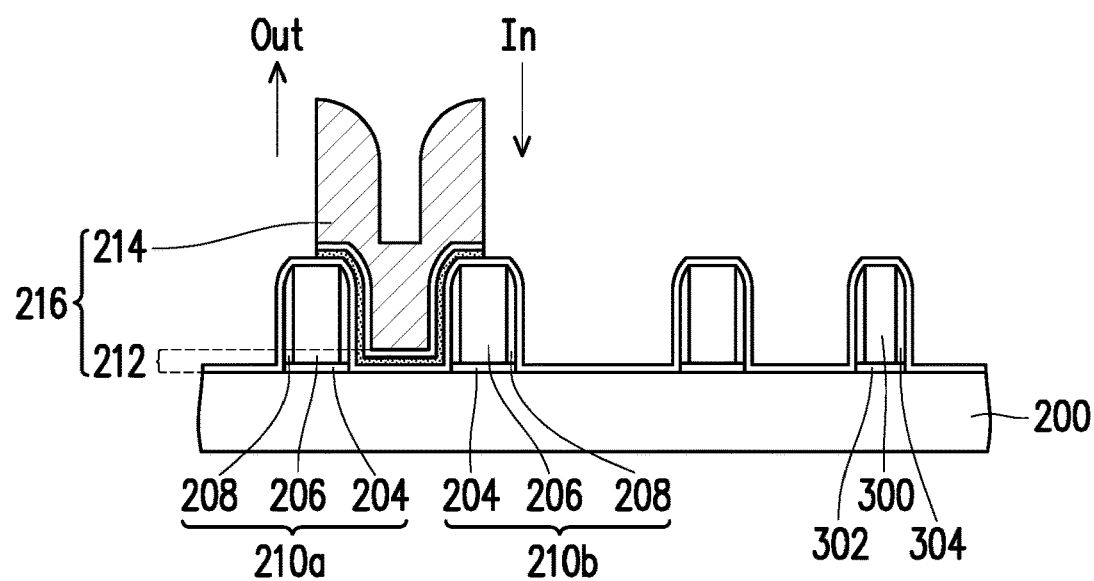

With reference to FIG. 8, the gate layer 256 and the charge storage layer 254 are etched by the photoresist layer 258 as an etching mask layer. Thereafter, the gate layer 256 and the charge storage layer 254 are defined as the memory gate structure 216 illustrated in FIG. 2. After etching, the remaining portion of the gate electrode layer 256 and the charge storage layer 254 becomes the memory gate layer 214 and the charge storage layer 212. The gate layer 206 and the gate insulation layer 204 on both sides of the memory gate structure 216 become a gate structure 210a and a gate structure 210b.

In an embodiment, the charge storage layer 212 is, for instance, an ONO stacked layer, so the bottom oxide layer thereof may be retained, for instance, to continuously cover the exposed surface of the substrate 200 and an upper surface of the gate layer 206, which should however not be construed as a limitation in the disclosure.

The non-volatile memory device provided in one or more embodiments of the disclosure includes three gate structures, wherein the memory gate structure 216 may store binary data, and the gate structure 210a and the gate structure 210b may be configured to perform reading and writing operations, for instance.

The structure of the non-volatile memory device may be integrated with a peripheral circuit including the gate layer 300. For instance, the gate structure 210b serves as a data input terminal IN, and the gate structure 210a serves as a data output terminal Out. The non-volatile memory device may serve as a temporary storage device, for instance. In an embodiment, when the peripheral circuit is to be turned off, the current status data may be stored in the non-volatile memory device through the gate structure 210b. When the peripheral circuit is again activated, the status data stored in the non-volatile memory device may be read out through the gate structure 210a.

As to operation, in an embodiment, an external circuit may apply an appropriate operating voltage to the gate structure, so that the gate structure 210b may transmit the voltage value corresponding to the binary data to the memory gate structure 216. During the reading operation, the gate structure 210a may output the stored binary data.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:
1. A non-volatile memory device, comprising:
   a substrate;
   a first gate structure, disposed on the substrate;
   a second gate structure, disposed on the substrate;
   a memory gate structure, disposed on the substrate and between the first gate structure and the second gate structure and covering at least the first gate structure and the second gate structure, wherein the memory gate structure comprises:

a charge storage layer, disposed on the substrate, wherein the charge storage layer between the first gate structure and the second gate structure is a continuous structure; and a memory gate layer, disposed on the charge storage layer and covering at least one portion of upper surfaces of the first gate structure and the second gate structure, wherein outer sidewalls of the memory gate layer are coplanar with sidewalls of the charge storage layer, and each outer sidewall of the memory gate layer is respectively above the first gate structure and the second gate structure.

2. The non-volatile memory device according to claim 1, wherein the charge storage layer has an oxide/nitride/oxide structure.

3. The non-volatile memory device according to claim 1, further comprising a spacer located on the sidewalls of the first gate structure and the second gate structure and covered by the charge storage layer.

4. The non-volatile memory device according to claim 1, wherein the memory gate structure fills a recess between the first gate structure and the second gate structure, a side area of the memory gate structure is lifted to cover the at least one portion of the upper surfaces of the first gate structure and the second gate structure.

5. The non-volatile memory device according to claim 1, further comprising a third gate structure disposed on the substrate.

6. The non-volatile memory device according to claim 1, wherein the first gate structure is configured to transmit a voltage value corresponding to binary data to the memory gate structure, and the second gate structure is configured to output the binary data.

7. A method for manufacturing a non-volatile memory device, the method comprising:
   providing a substrate;
   forming a first gate structure and a second gate structure on the substrate;
   forming a charge storage layer covering the first gate structure, the second gate structure, and the substrate;
   forming a memory gate layer on the charge storage layer; and
   defining the memory gate layer and the charge storage layer to form a memory gate structure, wherein the charge storage layer between the first gate structure and the second gate structure is a continuous structure, wherein the memory gate structure covers at least one portion of upper surfaces of the first gate structure and the second gate structure, wherein outer sidewalls of the memory gate layer are coplanar with sidewalls of the charge storage layer, and each outer sidewall of the memory gate layer is respectively above the first gate structure and the second gate structure.

8. The method according to claim 7, wherein the charge storage layer has an oxide/nitride/oxide structure.

9. The method according to claim 7, wherein the memory gate layer and the charge storage layer are defined with use of a mask layer.

10. The method according to claim 7, further comprising forming a spacer on the sidewalls of the first gate structure and the second gate structure, the spacer being covered by the charge storage layer.

11. The method according to claim 7, wherein the memory gate structure fills a recess between the first gate structure and the second gate structure, and a side area of the memory gate structure is lifted to cover the at least one portion of the upper surfaces of the first gate structure and the second gate structure.

12. The method according to claim 7, further comprising a third gate structure disposed on the substrate.

13. The method according to claim 7, wherein the first gate structure is configured to transmit a voltage value corresponding to binary data to the memory gate structure, and the second gate structure is configured to output the binary data.

* * * * *